United States Patent [19]
Simons

[11] Patent Number: 4,631,728
[45] Date of Patent: Dec. 23, 1986

[54] THERMOELECTRIC COOLER CONTROL CIRCUIT

[75] Inventor: Brent S. Simons, Santa Clara, Calif.

[73] Assignee: The United States of America as represented by the Secretary of the Navy, Washington, D.C.

[21] Appl. No.: 757,397

[22] Filed: Jul. 22, 1985

[51] Int. Cl.$^4$ .............................................. H01S 3/00
[52] U.S. Cl. ...................................... 372/38; 372/34; 372/29
[58] Field of Search .................... 372/38, 34, 33, 29

[56] References Cited

FOREIGN PATENT DOCUMENTS 0152880 12/1979 Japan .................................... 378/34
0224931 12/1984 Japan .................................... 378/34

*Primary Examiner*—Leon Scott, Jr.
*Attorney, Agent, or Firm*—R. F. Beers; C. D. B. Curry

[57] ABSTRACT

A thermoelectric cooler control circuit for a laser diode that has its temperature regulated by a thermoelectric cooler and its temperature sensed by a laser diode temperature sensor. The purpose of the control circuit is to regulate the thermoelectric cooler to maintain the laser diode at a constant temperature. The output of the laser diode temperature sensor is amplified and compared to a reference voltage in an integrator. The output of the integrator controls a pulse width modulator that controls a switching transistor that varies the pulse duration of power applied to a filter network. The power output of the filter network is applied to a mode controller that is controlled by the output of the integrator so that the mode controller switches the direction that power is applied to the thermoelectric cooler to maintain the temperature of the laser diode at a constant level.

5 Claims, 2 Drawing Figures

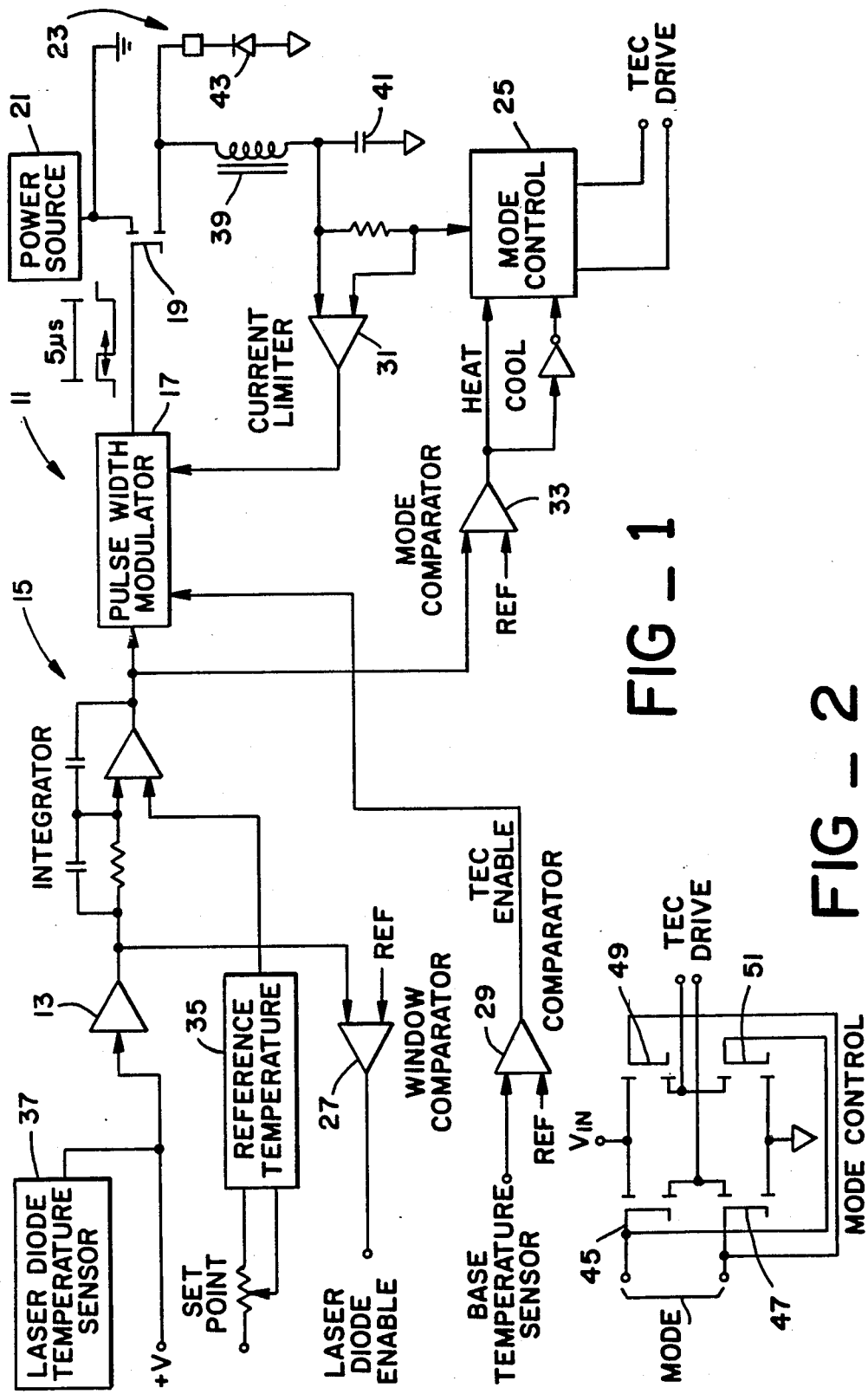

THERMOELECTRIC COOLER CONTROL CIRCUIT

BACKGROUND OF THE INVENTION

1. Field of the Invention

This invention relates to an electrical control circuit and more particularly to an electrical control circuit for use with a thermoelectric cooler.

2. Description of the Prior Art

Many different types of control circuits have been designed for regulating power applied to electric equipment. However, unique problems and constraints have been encountered in the area of thermoelectric coolers for use with laser diodes to maintain constant operating temperatures. The system requirements include a control circuit that drives a thermoelectric cooler and maintains a laser diode load at a preset temperature within tolerances of, for example, one-half degree centigrade in the presence of ambient temperature variations ranging between −55° C. to +100° C. Other design constraints include compatibility of the control circuit hybridization and the achievement of maximum circuit efficiency to minimize power consumption. One possible solution to these problems to use of a series pass transistor to control the thermoelectric cooler load current which would be driven by a suitable amplifier with a thermistor sensor at the load for temperature feedback and a DC proportional controller for series pass transistor control. The difficulty with this approach is that the efficiency of a DC proportional controller is of the order of only 50 percent due to losses in the series pass output transistor. Since the thermoelectric cooler can require a large amount of power, for example it can require up to 12 Watts of input power under full load conditions, the overall system losses becomes excessive.

The present invention overcomes these difficulties by providing a pulse width modulator controller, switching transistor and a network filter to supply the load current for the thermoelectric cooler. While this approach is more complex than a DC controller it has the advantage of the output transistor operating between a fully-off and a saturated condition and thereby substantially improving circuit efficiency.

SUMMARY OF THE INVENTION

It is an object of the present invention to provide an effective control circuit for a thermoelectric cooler.

Another object of the present invention is to provide an efficient control circuit for use with a thermoelectric cooler and a laser diode.

Still another object of the present invention is to provide a control circuit that employs a pulse width modulator controller, switching transistor and a network filter to supply the load current to a thermoelectric cooler.

These and other objects are accomplished by a thermoelectric cooler control circuit for a laser diode that has a temperature regulated by a thermoelectric cooler and its temperature sensed by a solid state temperature sensor. The purpose of the control circuit is to regulate the thermoelectric cooler to maintain the laser diode at a constant temperature. The output of the temperature sensor is amplified and compared to a reference voltage in an integrator. The output of the integrator controls a pulse width modulator that controls a switching transistor that varies the pulse duration applied to a filter network. The power output of the filter network is applied to a mode controller that is by the output of the integrator so that the mode controller switches the direction that current is applied to the thermoelectric cooler causing the thermoelectric cooler to either heat or cool in order to maintain the temperature of the laser diode at a constant level.

BRIEF DESCRIPTION OF THE DRAWINGS

FIG. 1 is a schematic diagram of the thermoelectric cooler control circuit of the present invention; and FIG. 2 is a schematic diagram of the mode control device of FIG. 1.

DESCRIPTION OF THE PREFERRED EMBODIMENT

The load for the thermoelectric cooler with which the control circuit of FIG. 1 is used consists of a laser diode with a detector and temperature sensor and a chip resistor mounted on a common substrate. The heat load from the laser is in the order of 80 to 100 milliwatts. Other heat losses include wire bond conduction losses to connection pads on the laser diode substrate block and convection losses. The worst-case thermal loss at the highest required operating temperature requires a thermoelectric cooler with a heat pumping capability of approximately 1 Watt to maintain the laser diode at +20° C., for example.

In FIG. 1 is shown the thermoelectric cooler control circuit 11 of the present invention comprising an amplifier 13, integrator 15, pulse width modulator 17, output switching transistor 19, power source 21, filter network 23, mode controller 25, window comparator 27, base plate temperature comparator 29, current limit comparator 31, mode comparator 33 and reference voltage device 35.

The laser diode temperature sensor 37, located adjacent to the laser diode, provides a current output proportional to temperature. Output current from sensor 37 is amplified and converted to a voltage output by transimpedance amplifier 13. The gain slope of amplifier 13 provides an output voltage of 10 millivolts, for example, per degree Kelvin. In this embodiment at an operating temperature of +20° C. the output of amplifier 13 is then equal to 2.93 volts. The output voltage of amplifier 13 is a temperature sense signal that is applied to integrator 15 which compares the temperature sense voltage to a preset reference level, established by reference voltage device 35, which corresponds to the desires operating set-point temperature. Integrator 15 is a three term controller performing proportional as well as integral and derivative control. The error voltage output of integrator 15 provides the control input to pulse width modulator 17. The output pulse of pulse width modulator 17 can vary its duty cycle from 0 to 90 percent, for example, depending on the error input voltage. In this embodiment the interpulse interval is fixed at 5 microseconds (200 kHz).

The output of switching transistor 19, which in this embodiment is switched between 0 and +10 volts, is applied to filter network 23 consisting of inductor 39, capacitor 41 and catch diode 43. Due to the high operating frequency of the pulse width modulator, the filter components are of reasonably small size as shown on FIG. 1. In this embodiment the filter network provides a DC drive of up to 4 volts and 3 amps with a ripple component under 2 percent which is below the 10 percent maximum limit of the thermoelectric cooler. The DC power input to the thermoelectric cooler and thus the temperature is a function of the duty cycle of the pulse width modulator which is controlled by the error voltage output of integrator 15 and is proportional to the difference between the set point temperature and the sensor temperature.

A thermoelectric cooler will operate as an efficient heater by reversing the direction of current through the device. To be able to maintain the set point temperature at the laser diode when the ambient is below +20° C., it was necessary to develop a mode controller 25 to switch the direction of drive current through the thermoelectric cooler to allow a heat mode of operation. As shown in FIG. 2 this was accomplished by four "HEXFET" transistors allow the current to be reversed through the thermoelectric cooler. In addition, the mode controller 25 has a narrow dead band at the transition between modes (heat and cool), equal to about 0.05° C.

The thermoelectric cooler control circuit 11 also includes several safety features to prevent damage to the laser diode and cooler. One of these is window comparator 27 that senses the output voltage of amplifier 13 and generates a logic level to allow the laser diode to turn on only when the laser temperature is within ±5 degrees of set point, for example. In addition, the base plate temperature is sensed at a location near the thermoelectric cooler and compared to a reference level by temperature comparator 29. If the base plate should become hotter than +115° C., for example, the cooler will automatically shut down in order to prevent additional heating effects that would occur with cooler operating at full capacity. Current limit controller 31 limits the maximum current to the thermoelectric cooler in the cool mode to 3 Amps and 1.5 Amps in the heat mode, for example. This was necessary as the cooler is driven at full power (12 Watts in cool and 4.5 Watts in heat mode) in order to improve the time to set point when the system is first turned on.

Obviously many modifications and variations of the present invention are possible in the light of the above teachings. It is therefore to be understood that within the scope of the appended claims the invention may be practiced otherwise than as specifically described.

What is claimed is:

1. A thermoelectric cooler control circuit for a laser diode that has its temperature regulated by a thermoelectric cooler and its temperature sensed by a laser diode temperature sensor including:
   (a) an amplifier, an integrator, a pulse width modulator, a reference voltage generator, a power source, a switching transistor, a filter network and a mode controller;
   (b) the output of said laser diode temperature sensor being applied to the input of said amplifier, the output of said amplifier being applied to a first input of said integrator, the output of said reference voltage generator being applied to a second input of said integrator, the output of said integrator being applied to a first input of said pulse width modulator, the output of said pulse width modulator being applied to the base of said transistor, the output of said power source being passed through said transistor to the input of said filter network, the output of said filter network being connected to the input of said mode controller, the output of said mode controller being connected to the power input of said thermoelectric cooler; whereby
   (c) the voltage output of said reference voltage generator is selected to establish a preselected laser diode temperature and said integrator provides an output signal to said pulse width modulator and to said mode controller to apply power to said thermoelectric cooler to maintain said laser diode at a constant temperature.

2. The circuit of claim 1 further including:
   (a) a mode comparator;
   (b) the output of said integrator being connected to one input of said mode comparator and the other input to said mode comparator being connected to a temperature reference signal; whereby
   (c) the output of said mode comparator is applied to the input of said mode controller to raise or lower the cooling capacity of said thermoelectric cooler.

3. The circuit of claim 2 further including:
   (a) a current limiter;
   (b) the input of said current limiter is connected to the output of said filter network and the output of said current limiter connected to the input of said pulse width modulator.

4. The circuit of claim 3 further including:
   (a) a laser diode enable device operably connected to the input of said integrator and to a reference temperature source.

5. The circuit of claim 4 further including:
   (a) a comparator;
   (b) a base temperature sensor connected to one input of said comparator and said reference temperature signal being connected to the other input of said comparator and the output of said comparator being connected to the enable input of said pulse width modulator to enable system operation when said base temperature is at a reference level.

* * * * *